United States Patent
Sumiyoshi et al.

(10) Patent No.: US 11,656,554 B2
(45) Date of Patent: May 23, 2023

(54) EXPOSURE APPARATUS, EXPOSURE METHOD, AND METHOD OF MANUFACTURING ARTICLE

(71) Applicant: CANON KABUSHIKI KAISHA, Tokyo (JP)

(72) Inventors: Yuhei Sumiyoshi, Utsunomiya (JP); Daisuke Kobayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 228 days.

(21) Appl. No.: 17/069,146

(22) Filed: Oct. 13, 2020

(65) Prior Publication Data
US 2021/0116677 A1  Apr. 22, 2021

(30) Foreign Application Priority Data
Oct. 18, 2019 (JP) .............................. JP2019-191156

(51) Int. Cl.
*G03F 7/20* (2006.01)

(52) U.S. Cl.
CPC ...... *G03F 7/70091* (2013.01); *G03F 7/70133* (2013.01)

(58) Field of Classification Search
CPC ............ G03F 7/70091; G03F 7/70133; G03F 7/70891; G03F 7/7055; G03F 7/70591; G03F 7/70716
See application file for complete search history.

(56) References Cited

U.S. PATENT DOCUMENTS

| | | | |
|---|---|---|---|
| 7,684,013 B2 | 3/2010 | Hansen et al. | |
| 7,817,249 B2 | 10/2010 | Uehara | |
| 2006/0244940 A1* | 11/2006 | Uehara | G03F 7/70891 355/53 |
| 2009/0002667 A1* | 1/2009 | Sekine | G03B 27/54 355/67 |
| 2010/0290020 A1* | 11/2010 | Mori | G03F 7/70891 359/285 |

FOREIGN PATENT DOCUMENTS

| | | | | |
|---|---|---|---|---|
| EP | 1081553 A2 * | 3/2001 | ......... | G03F 7/70358 |
| JP | 2010171447 A | 8/2010 | | |

* cited by examiner

*Primary Examiner* — Peter B Kim
(74) *Attorney, Agent, or Firm* — Rossi, Kimms & McDowell LLP

(57) ABSTRACT

The present invention provides an exposure apparatus that exposes a substrate via an original, including an illumination optical system configured to illuminate the original, and a projection optical system configured to project a pattern of the original onto the substrate, wherein the illumination optical system illuminates the original by illumination light which includes a first portion that enters an incident pupil of the projection optical system and a second portion which enters a region outside the incident pupil, and the first portion and the second portion are separated from each other on an incident pupil plane of the projection optical system.

18 Claims, 9 Drawing Sheets

EXPOSURE APPARATUS, EXPOSURE METHOD, AND METHOD OF MANUFACTURING ARTICLE

BACKGROUND OF THE INVENTION

Field of the Invention

The present invention relates to an exposure apparatus, an exposure method, and a method of manufacturing an article.

Description of the Related Art

An exposure apparatus that illuminates an original (a reticle or a mask) by an illumination optical system and projects a pattern of the original onto a substrate (wafer) via a projection optical system has been conventionally used. In an exposure apparatus, it is known that the optical characteristic (image formation characteristic) of a projection optical system gradually changes by light (exposure light) irradiation.

In recent years, so-called dipole illumination that uses, as an effective light source, only two regions sandwiching the optical axis on the pupil plane of an illumination optical system is used in an exposure apparatus when an original pattern which mainly includes a predetermined line-and-space pattern is to be transferred. In this case, an optical member near the pupil plane of a projection optical system will be illuminated by exposure light with greatly different distribution states in the X direction and the Y direction (two directions which are perpendicular to each other). In addition, in the original pattern including mainly a predetermined line-and-space pattern, the optical member near the pupil plane of the projection optical system will be illuminated in greatly different states in the x direction and the y direction even if normal illumination is used. This is because diffracted light from the original pattern is mainly generated in only a single direction.

In such an exposure apparatus, a rotationally asymmetric aberration change (for example, astigmatism on the optical axis) may be generated in the projection optical system. Hence, Japanese Patent Laid-Open No. 2010-171447 proposes an exposure apparatus that adopts a technique for suppressing such an aberration change.

However, since the technique disclosed in Japanese Patent Laid-Open No. 2010-171447 requires an equipment to irradiate an optical member near the pupil plane of a projection optical system with a light beam having a wavelength range different from the wavelength range of the exposure light beam, the apparatus arrangement can become complicated and increase the cost.

SUMMARY OF THE INVENTION

The present invention provides an exposure apparatus that has a simple arrangement, and is advantageous in maintaining the optical characteristic of a projection optical system in a favorable state.

According to one aspect of the present invention, there is provided an exposure apparatus that exposes a substrate via an original, including an illumination optical system configured to illuminate the original, and a projection optical system configured to project a pattern of the original onto the substrate, wherein the illumination optical system illuminates the original by illumination light which includes a first portion that enters an incident pupil of the projection optical system and a second portion which enters a region outside the incident pupil, and the first portion and the second portion are separated from each other on an incident pupil plane of the projection optical system.

Further aspects of the present invention will become apparent from the following description of exemplary embodiments with reference to the attached drawings.

DESCRIPTION OF THE EMBODIMENTS

Figure 1:
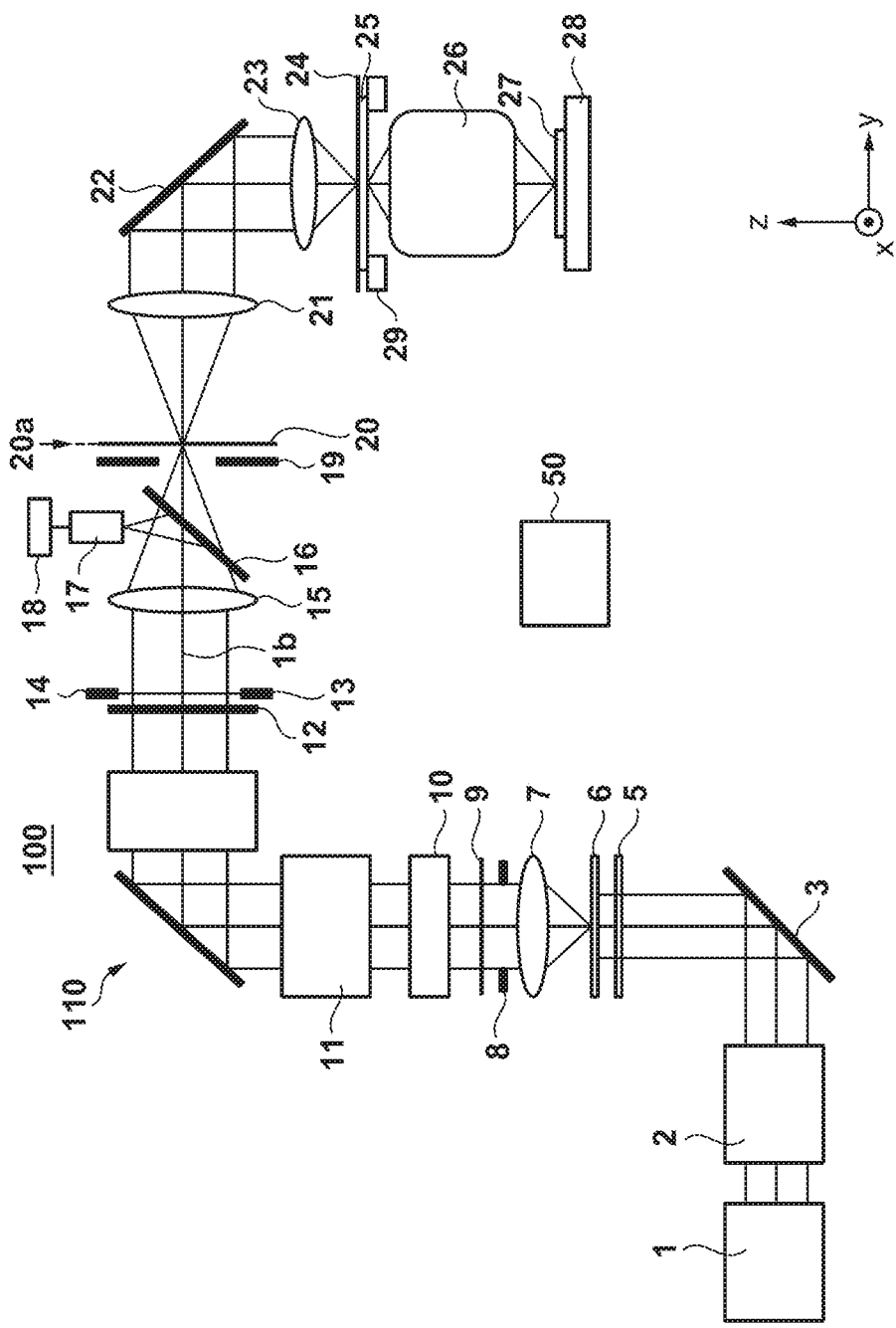
FIGS. 1A and 1B are views showing the arrangement of an exposure apparatus as an aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate.

Furthermore, in the attached drawings, the same reference numerals are given to the same or similar configurations, and redundant description thereof is omitted.

FIGS. 1A and 1B are views showing the arrangement of an exposure apparatus 100 as an aspect of the present invention. FIG. 1A is a schematic sectional view of the exposure apparatus 100, and FIG. 1B is a schematic top view of a substrate stage 28 of the exposure apparatus 100. The exposure apparatus 100 is a lithography apparatus that forms a pattern on a substrate and is used in a manufacturing process of a semiconductor device or the like. In this embodiment, the exposure apparatus 100 is a step-and-scan exposure apparatus (scanner) that exposes (scans and exposes) a substrate 27 while moving an original 25 and the substrate 27 in a scanning direction to transfer the pattern of the original 25 onto the substrate. However, the exposure apparatus 100 can also employ a step-and-repeat method or other exposure methods.

The exposure apparatus 100 includes, as shown in FIG. 1A, an illumination optical system 110 that illuminates the original 25 (a reticle or a mask) with light from a light source 1 and a projection optical system 26 that projects the pattern of original 25 onto the substrate 27 (a wafer, a glass plate, or the like). The exposure apparatus 100 also includes an original stage 29, a substrate stage 28, and a control unit 50. The substrate stage 28 has a function of moving in a first direction and a second direction perpendicular to each other in a substrate plane. In this embodiment, as shown in FIGS. 1A and 1B, a coordinate system in which the first direction is set as the y direction (y-axis), the second direction is set as the x direction (x-axis), and a direction perpendicular to the first direction and the second direction is set as the z direction (z-axis) with respect to the substrate stage 28 as a reference.

The light source 1 includes a mercury lamp having a wavelength of approximately 365 nm and excimer lasers such as a KrF excimer laser having a wavelength of approximately 248 nm, an ArF excimer laser having a wavelength of approximately 193 nm, and the like, and emits light (exposure light) for illuminating the original 25.

The illumination optical system 110 includes a relay optical system 2, an exit angle storing optical element 5, a diffraction optical element 6, a condenser lens 7, a light shielding member 8, a prism unit 10, and a zoom lens unit 11. The illumination optical system 110 also includes an optical integrator 12, a stop 13, a condenser lens 15, a light shielding unit 19, a masking unit 20, a condenser lens 21, and a collimator lens 23.

The relay optical system 2 is arranged between the light source 1 and the exit angle storing optical element 5 to guide the light from the light source 1 to the exit angle storing optical element 5. The exit angle storing optical element 5 is arranged on the light source side of the diffraction optical element 6 and includes an optical integrator such as a fly's-eye lens, a microlens array, a fiber bundle, or the like. The exit angle storing optical element 5 guides the light from the light source 1 to the diffraction optical element 6 while maintaining a constant angle of divergence. The exit angle storing optical element 5 reduces the influence from a change in the output of the light source 1 on a light intensity distribution (pattern distribution) formed by the diffraction optical element 6.

The diffraction optical element 6 is arranged on a plane that has a Fourier transform relationship with a pupil plane 14 of the illumination optical system 110. The diffraction optical element 6 forms, on the pupil plane 14 of the illumination optical system 110 which is a plane conjugate to the pupil plane of the projection optical system 26 and a plane conjugate to the pupil plane 14 of the illumination optical system 110, a desired light intensity distribution by converting the light intensity distribution of the light from the light source 1 by a diffraction effect. The diffraction optical element 6 may be formed by a CGH (Computer Generated Hologram) that has been designed by a computer so that a desired diffraction pattern can be obtained on a diffraction pattern plane. In this embodiment, the light source shape formed on the pupil plane of the projection optical system 26 will be referred to as an effective light source shape. Note that an "effective light source" means the light intensity distribution or the light angle distribution on a surface to be illuminated or a conjugate plane of the surface to be illuminated. The diffraction optical element 6 is arranged between the exit angle storing optical element 5 and the condenser lens 7.

A plurality of diffraction optical elements 6 can be arranged in the illumination optical system 110. For example, each of the plurality of diffraction optical elements 6 is attached to (mounted onto) a corresponding one of a plurality of slots of a turret (not shown). The plurality of diffraction optical elements 6 form different effective light source shapes. These effective light source shapes include a small circular shape (comparatively small circular shape), a large circular shape (comparatively large circular shape), an annular shape, a dipole shape, a quadrupole shape, and other shapes. A method that illuminates a surface to be illuminated by an effective light source shape having an annular shape, a dipole shape, or a quadrupole shape is referred to as modified illumination.

The light from the exit angle storing optical element 5 is diffracted by the diffraction optical element 6 and is guided to the condenser lens 7. The condenser lens 7 is arranged between the diffraction optical element 6 and the prism unit 10, focuses the light diffracted by the diffraction optical element 6, and forms a diffraction pattern (light intensity distribution) on a Fourier transform plane 9.

The Fourier transform plane 9 is between the optical integrator 12 and the diffraction optical element 6 and is a plane which has an optical Fourier transform relationship with the diffraction optical element 6. The shape of the diffraction pattern formed on the Fourier transform plane 9 can be changed by changing the diffraction optical element 6 to be arranged on the optical path of the illumination optical system 110.

The light shielding member 8 is arranged to be movable in a direction perpendicular to an optical axis 1b of the illumination optical system 110, and is arranged on the upstream side (light source side) of the Fourier transform plane 9. The light shielding member 8 is arranged at a position slightly away (defocused) from the position of the Fourier transform plane 9.

The prism unit 10 and the zoom lens unit 11 are arranged between the Fourier transform plane 9 and the optical integrator 12 and function as a zoom optical system that expands the light intensity distribution formed on the Fourier transform plane 9. The prism unit 10 adjusts the annular ratio or the like of the light intensity distribution formed on the Fourier transform plane 9 and guides the adjusted light intensity distribution to the zoom lens unit 11. Also, the zoom lens unit 11 is arranged between the prism unit 10 and the optical integrator 12. The zoom lens unit 11 includes, for example, a plurality of zoom lenses. The zoom lens unit 11 adjusts the σ value of the diffraction pattern which is based on the ratio between the NA (Numerical Aperture) of the illumination optical system 110 and the NA of the projection optical system 26 to guide the light intensity distribution formed on the Fourier transform plane 9 to the optical integrator 12.

The optical integrator 12 is arranged between the zoom lens unit 11 and the condenser lens 15. The optical integrator 12 can include a fly's-eye lens that forms a plurality of secondary light sources in accordance with the light intensity distribution whose annular ratio, aperture angle, and σ value have been adjusted and guides the plurality of secondary light sources to the condenser lens 15. However, the optical integrator 12 may include another optical element such as an optical pipe, a diffraction optical element, a microlens array, or the like instead of the fly's-eye lens. The optical integrator 12 uniformly illuminates the original 25 arranged on a surface 24 to be illuminated with the light that has passed through the diffraction optical element 6. The stop 13 is arranged between the optical integrator 12 and the condenser lens 15 near the pupil plane 14 of the illumination optical system 110.

The condenser lens 15 is arranged between the optical integrator 12 and the original 25. As a result, the plurality of light beams guided from the optical integrator 12 can be condensed and the original 25 can be illuminated with the condensed plurality of lights in a superimposed manner. After the light beams enter the optical integrator 12 and are condensed by the condenser lens 15, a conjugate plane 20*a* which is the focal plane of the condenser lens 15 is illuminated by a substantially rectangular shaped light beam.

A half-mirror 16 is arranged on a stage subsequent to the condenser lens 15. A part of the exposure light reflected by the half-mirror 16 enters a light amount measurement optical system 17. A sensor 18 which measures the light amount is arranged on a stage subsequent to the light amount measurement optical system 17. The exposure amount at the time of exposure is appropriately controlled based on the light amount measured by the sensor 18.

A masking unit 20 including an X blade and a Y blade is arranged on the conjugate plane 20*a*, which is a plane conjugate to the surface 24 to be illuminated, and a substantially rectangular shaped light intensity distribution illuminates the conjugate plane. The masking unit 20 is arranged to delimit the illumination range of the original 25 (the surface 24 to be illuminated) and is scanned in synchronization with the original stage 29 and the substrate stage 28. The original stage 29 is a stage that holds and moves the original 25, and the substrate stage 28 is a stage that holds and moves the substrate 27.

The light shielding unit 19 is arranged at a position away (defocused) from the masking unit 20 (the conjugate plane 20*a* of the surface 24 to be illuminated). Light reflected by a mirror 22 that has a predetermined tilt with respect to the light beam from the condenser lens 21 illuminates the original 25 via the collimator lens 23.

Figure 2:
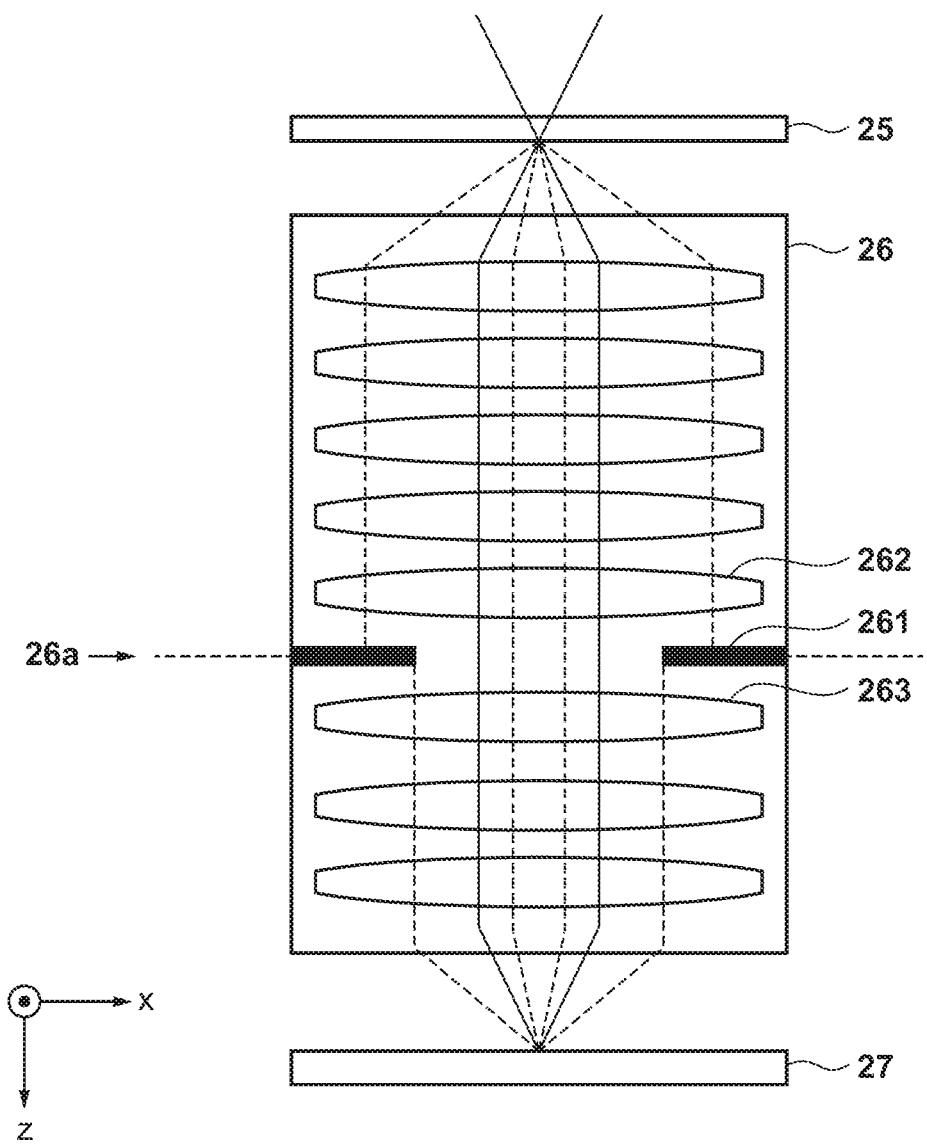
FIG. 2 is a view schematically showing a section of a projection optical system.

The projection optical system 26 projects the pattern of the original 25 onto the substrate 27. FIG. 2 is a view schematically showing the section of the projection optical system 26. The projection optical system 26 includes a plurality of optical members (optical elements such as lenses, mirrors, and the like) as shown in FIG. 2. An aperture stop 261 whose diameter of opening can be changed is arranged on a pupil plane 26*a* of the projection optical system 26. By adjusting the diameter of the opening of the aperture stop 261, the NA of the projection optical system 26 can be set to a desired value. The resolution of the pattern of the original 25 depends on the NA and the effective light source shape of the projection optical system 26. Hence, the resolution of the pattern of the original 25 can be improved by appropriately setting (selecting) the NA and the effective light source shape of the projection optical system 26.

The control unit 50 is formed by a computer (information processing apparatus) including a CPU, a memory, and the like, and causes the exposure apparatus 100 to operate by integrally controlling each unit of the exposure apparatus 100 in accordance with a program stored in a storage unit. The control unit 50 controls the exposure process of exposing the substrate 27 and various kinds of processing related to the exposure process. In this embodiment, the control unit 50 executes, for example, processing (determination method) to determine the illumination shape (illumination light) to be used to illuminate the pattern of the original 25.

Figure 3:
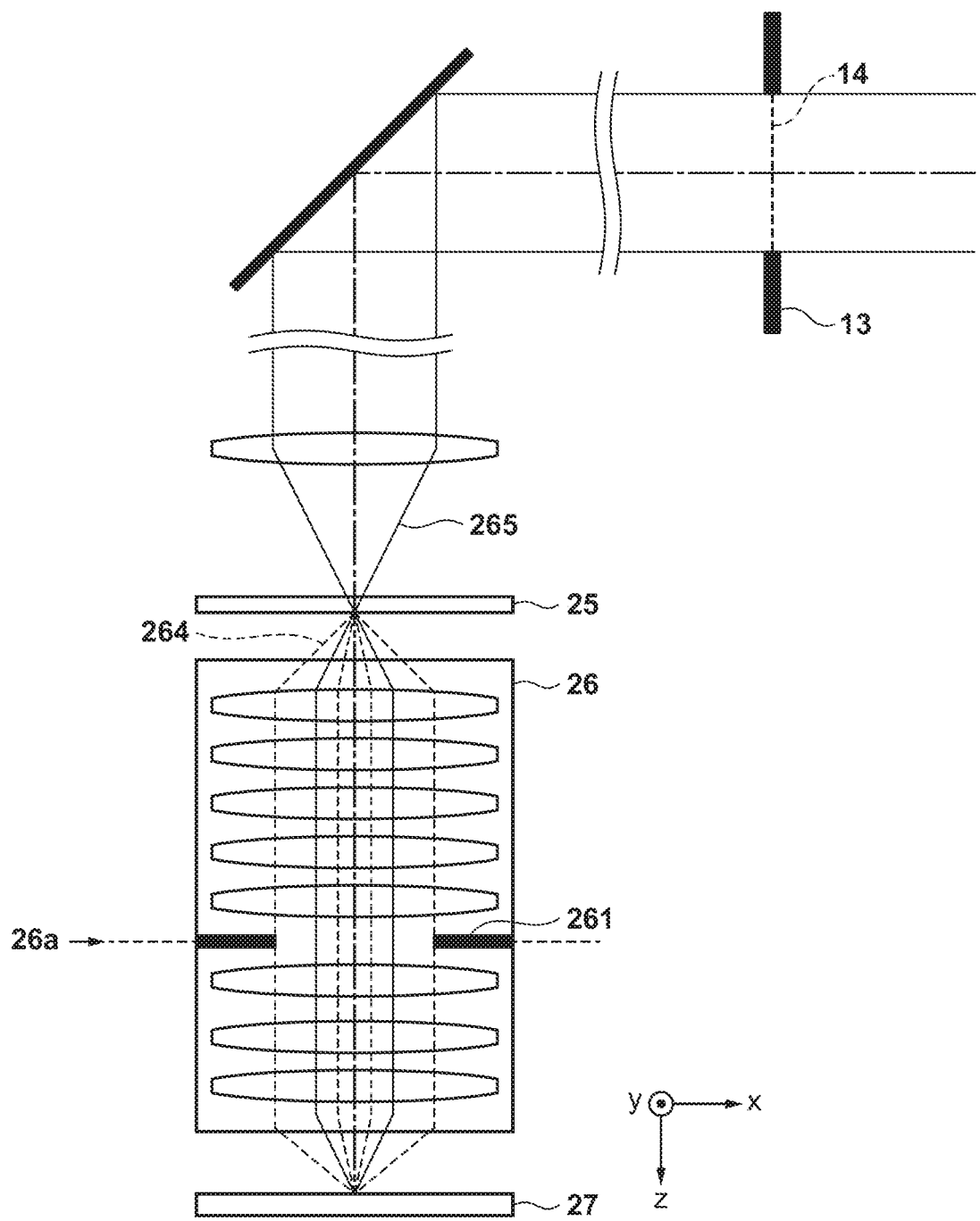
FIG. 3 is a view for explaining the relationship between an aperture arranged in an illumination optical system and an aperture stop arranged in the projection optical system.

The relationship between the stop 13 arranged on the pupil plane 14 or near the pupil plane 14 of the illumination optical system 110 and the aperture stop 261 arranged on the pupil plane 26*a* of the projection optical system 26 will be described with reference to FIG. 3. As described above, the aperture stop 261 arranged on the pupil plane 26*a* of the projection optical system 26 determines the NA of the projection optical system 26. In FIG. 3, light that passes through the edge of the NA of the projection optical system 26 is indicated by dashed lines 264. On the other hand, the stop 13 arranged on the pupil plane 14 or near the pupil plane 14 of the illumination optical system 110 determines the NA of the light illuminating the original 25, that is, the NA of the illumination optical system 110. In FIG. 3, the light illuminating the original 25 is indicated by solid lines 265. The diameter of the opening of the stop 13 can be changed in a similar manner to that of the aperture stop 261. The NA of the illumination optical system 110 can be set to a desired value by adjusting the diameter of the opening of the stop 13.

In general, in a conventional technique, the NA of the illumination optical system 110 is set to a range that does not exceed the range of the projection optical system 26. In other words, it is set so that the coherent factor which is the ratio of the NA of the illumination optical system 110 and the NA of the projection optical system 26 will be a value that falls within a range from 0 to 1. However, depending on the setting of the exposure apparatus, the NA of the illumination optical system 110 can be set to be larger than the NA of the projection optical system 26. As will be described later, in this embodiment, the NA of the illumination optical system 110 is set to be larger than the NA of the projection optical system 26. The pupil plane 14 of the illumination optical system 110 and the pupil plane 26*a* of the projection optical system 26 have a conjugate relationship, and a light intensity distribution which has the same shape as the light intensity distribution formed on the pupil plane 14 of the illumination optical system 110 is formed on the pupil plane 26*a* of the projection optical system 26.

In recent years, along with the micropatterning of device patterns, a design that mainly includes a predetermined line-and-space pattern is sometimes employed as the pattern (the original pattern) of the original 25. In such an original pattern, the diffracted light from the original 25 is mainly generated in only a single direction. The meaning of the phrase "generated in only a single direction" will be supplemented here. Consider a direction perpendicular to the lengthwise direction in which the predetermined line-and-space pattern is arranged, and consider a plane including this direction and the optical axis of the projection optical system 26. Diffracted light is generated when a plane wave that travels in a direction parallel to the optical axis of the projection optical system 26 enters the line-and-space pattern. At this time, the vectors of the directions of travel of the diffracted light beams of all orders are included in the plane described above. This is expressed as a state in which the diffracted light is generated in only a single direction in this embodiment.

In this manner, if the diffracted light is generated in a single direction, in a conventional technique, an optical member near the pupil plane 26*a* of the projection optical system 26 will be illuminated in a state in which the distribution greatly differs between the x direction and the y direction. As a result, the temperature distribution that is generated on the optical member near the pupil plane 26*a* of the projection optical system 26 will also have a shape in which the distribution greatly differs between the x direction and the y direction. Hence, a rotationally asymmetric aberration change, in particular, astigmatism on the optical axis (astigmatism on the axis) which is a rotationally asymmetric aberration component may be generated in (the image formation characteristic of) the projection optical system 26.

Figure 10A:
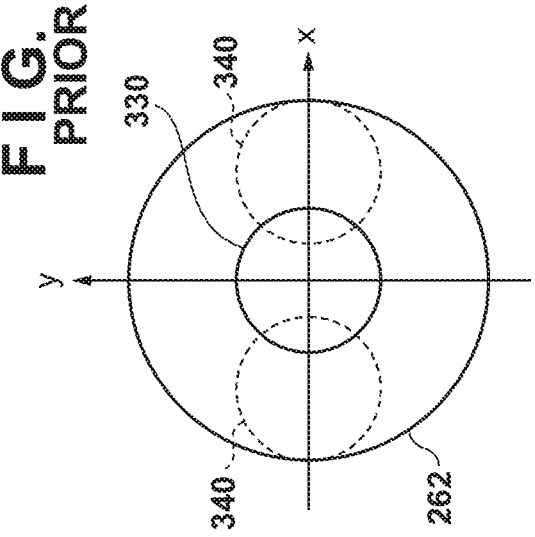
FIGS. 10A to 10D are views for explaining an exposure process according to the conventional technique.
Figure 10B:
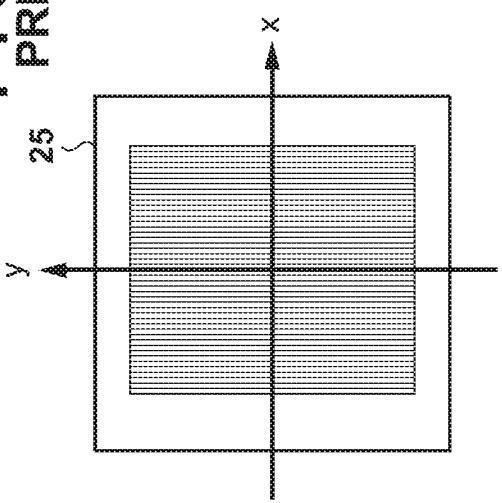

The exposure process according to the conventional technique will be described with reference to FIGS. 10A, 10B, 10C, and 10D. FIG. 10A shows the pattern (original pattern) of the original 25, and a pattern (to be referred to as a "V (Vertical) pattern" hereinafter) mainly including a line-and-space pattern in a direction parallel to the y-axis is set as the original pattern. FIG. 10B shows an effective light source on an incident pupil plane of the projection optical system 26. An incident pupil plane of the projection optical system 26 is a virtual plane for describing the behavior of a light beam on the pupil. The incident pupil plane of the projection optical system 26 includes, as the respective coordinate axes, an x component ξ and a y component η of the direction cosines seen from the object plane of the projection optical system 26. A boundary (edge) 31 of the pupil is an image obtained by projecting the opening edge of the aperture stop 261 of the projection optical system 26 onto the incident pupil plane. The inner side of the boundary 31 of the pupil is referred to as an "incident pupil", and the outer side of the boundary 31 of the pupil is referred to as "outside the incident pupil". An effective light source 300 is an image (a region irradiated with the illumination light) obtained by projecting the illumination light that illuminates the original pattern onto the incident pupil plane.

In a partially coherent imaging optical system such as the exposure apparatus 100, the effective light source 300 is arranged in an appropriate shape in a range that does not fall outside of the incident pupil of the projection optical system 26. In a case in which the original pattern is the V pattern (FIG. 10A), the direction in which the diffracted light is generated is a direction in which the component has shifted among the original light beam direction cosines. In FIG. 10B, illumination light beams diffracted by the original pattern shown in FIG. 10A are shown as diffracted light beams 320 on the incident pupil plane. In this manner, in relation to the V pattern, the diffracted light beams 320 obtained by shifting the effective light source 300 in the direction appear on the incident pupil plane. Note that in FIG. 10B, although each diffracted light beam 320 partially falls outside the incident pupil (that is, is vignetted by the aperture stop 261), this portion does not reach the image plane of the projection optical system 26.

Figure 10C:
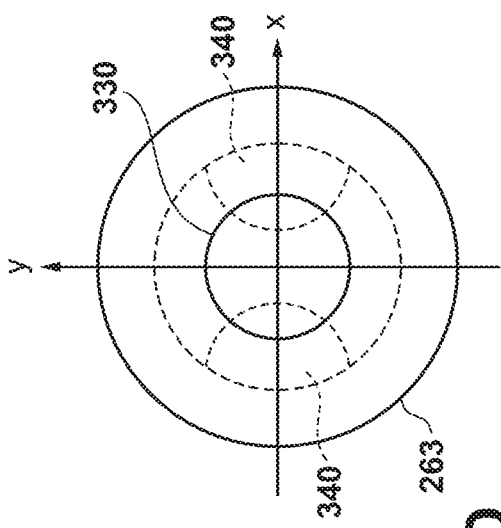

FIG. 10C shows a light intensity distribution formed on a lens 262 which is arranged near the pupil plane 26a of the projection optical system 26 and is arranged closer to the upstream side than the aperture stop 261. Referring to FIG. 10C, it can be seen that the light intensity distribution formed on the lens 262 is very similar to the light intensity distribution (FIG. 10B) on the incident pupil plane of the projection optical system 26 and includes a light intensity distribution 330 corresponding to the effective light source 300 and light intensity distributions 340 corresponding to the diffracted light beams. In this manner, since the light intensity distribution formed on the lens 262 has a narrow shape in the x-axis direction, the temperature distribution generated on the lens 262 has a shape in which the distribution greatly differs between the x direction and the y direction extending in the x-axis direction.

Figure 10D:
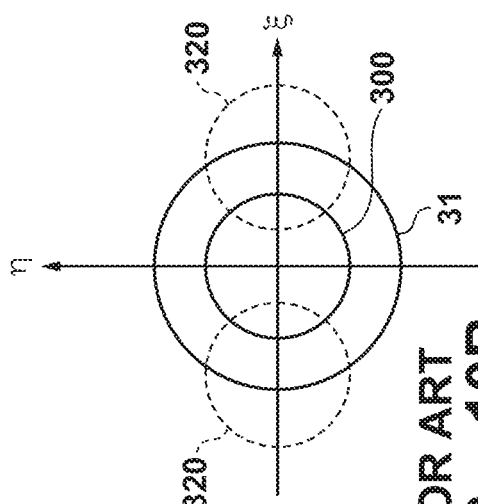

FIG. 10D shows a light intensity distribution formed on a lens 263 which is arranged near the pupil plane 26a of the projection optical system 26 and is arranged closer to the downstream side than the aperture stop 261. Referring to FIG. 10D, it can be seen that the light intensity distribution formed on the lens 263 includes the light intensity distribution 330 corresponding to the effective light source 300 and the light intensity distributions 340 corresponding to the diffracted light beams. In FIG. 10D, each diffracted light beam (the light intensity distribution 340) is partially vignetted by the aperture stop 261 and does not reach the lens 263. However, the fact that the light intensity distribution formed on the lens 263 has a shape in which the distribution greatly differs between the x direction and the y direction extending in the x-axis direction is similar to the light intensity distribution formed on the lens and the incident pupil plane of the projection optical system 26 (FIGS. 10B and 10C).

As shown in FIGS. 10B, 10C, and 10D, a rotationally asymmetric aberration, in particular, astigmatism on the axis is generated when the light intensity distribution formed on the incident pupil plane of the projection optical system 26 and on each of the lenses 262 and 263 has a shape in which the distribution greatly differs between the x direction and the y direction.

Therefore, this embodiment will provide a technique that is advantageous in maintaining the optical characteristic of the projection optical system 26 in a favorable state by suppressing the generation of a rotationally asymmetric aberration, particularly, astigmatism on the axis of the projection optical system 26.

Figure 4A:
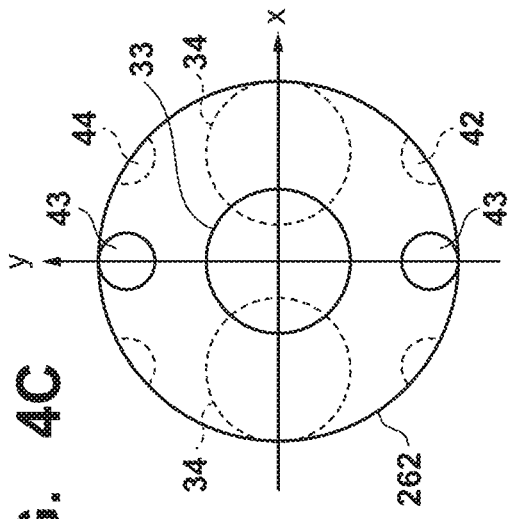
FIGS. 4A to 4D are views for explaining an exposure process according to this embodiment.

The exposure process according to this embodiment will be described with reference to FIGS. 4A, 4B, 4C, and 4D. Assume that the pattern (the original pattern) of the original 25 is a V pattern as shown in FIG. 4A. In this embodiment, such a V pattern is illuminated by illumination light including a first illumination light portion (first portion) 30 and second illumination light portions (second portions) 40 as shown in FIG. 4B. The first illumination light portion 30 enters the incident pupil of the projection optical system 26 and contributes to image formation of the original pattern in a similar manner to a normal effective light source. Each second illumination light portion 40 enters (a region) outside the incident pupil of the projection optical system 26. The first illumination light portion 30 and the second illumination light portions 40 are apart from each other on the incident pupil plane of the projection optical system 26. Note that in FIG. 4B, although each second illumination light portion 40 is in contact with the boundary (the boundary 31) of the incident pupil, the present invention is not limited to this. Each second illumination light portion may be spaced apart from the boundary of the incident pupil.

In FIG. 4B, diffracted light beams 32 are light beams obtained as a result of the first illumination light portion 30 being diffracted by the original pattern shown in FIG. 4A. At least a part of each diffracted light beam 32 enters the incident pupil of the projection optical system 26 and contributes to the image formation of the original pattern. Also, in FIG. 4B, diffracted light beams 42 are light beams obtained as a result of the second illumination light portions 40 being diffracted by the original pattern shown in FIG. 4A. Each diffracted light beam 42 enters outside the incident pupil of the projection optical system 26 in a similar manner to each second illumination light portions 40, and does not enter the incident pupil. Hence, the second illumination light portions 40 and the diffracted light beams 42 thereof will neither reach the image plane of the projection optical system 26 nor influence the image formation of the original pattern op at all.

Figure 4C:
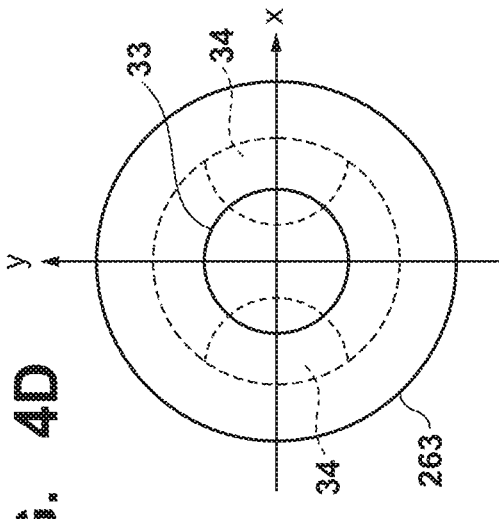
Figure 4B:
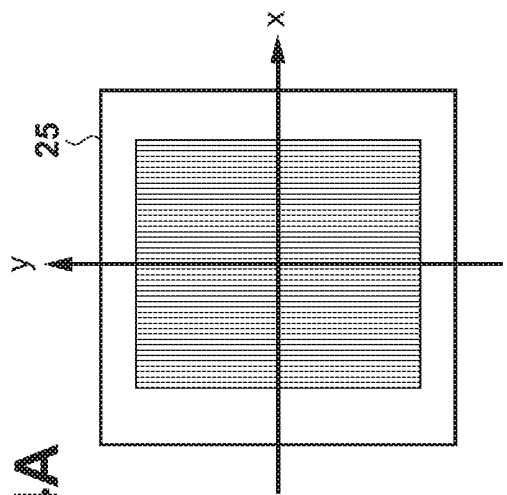

FIG. 4C shows a light intensity distribution formed on the lens 262 which is arranged near the pupil plane 26a of the projection optical system 26 and is closer to the upstream side than the aperture stop 261. Referring to FIG. 4C, it can be seen that the light intensity distribution formed on the lens 262 includes a light intensity distribution 33, light intensity distributions 34, light intensity distributions 43, and light intensity distributions 44. The light intensity distribution 33 is a light intensity distribution that corresponds to the first illumination light portion 30, and the light intensity distributions 34 are light intensity distributions that correspond to the diffracted light beams 32 of the first illumination light portion 30. Also, the light intensity distributions 43 are light intensity distributions that correspond to the second illumination light portions 40, and the light intensity distributions 44 are light intensity distributions that correspond to the diffracted light beams 42 of the second illumination light portions 40.

As shown in FIG. 4C, since the light intensity distribution 33 and each light intensity distribution 34 corresponding to the first illumination light portion 30 and each diffracted light beam 32, respectively, have a narrow shape in the x-axis direction in a similar manner to the light intensity distributions of the conventional technique, they can cause a rotational asymmetric aberration to be generated in the projection optical system 26. However, in this embodiment, since the light intensity distributions 43 and the light intensity distributions 44 corresponding to the second illumination light portions 40 and the diffracted light beams 42, respectively, are present at positions spaced apart from the x-axis, the asymmetry in the x and y directions of the temperature distribution generated on the lens 262 can be reduced.

Figure 4D:
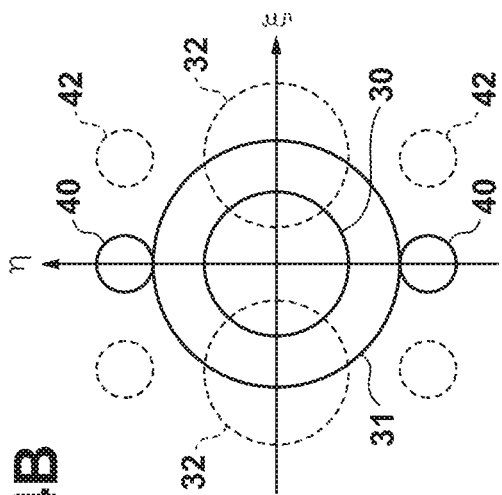

FIG. 4D shows a light intensity distribution formed on the lens 263 which is arranged near the pupil plane 26a of the projection optical system 26 and is arranged closer to the downstream side than the aperture stop 261. Referring to FIG. 4D, it can be seen that the light intensity distributions 43 and the light intensity distributions 44 are not present on the lens 263, which is positioned closer to the image plane of the projection optical system 26 than the aperture stop 261, because the second illumination light portions 40 and the diffracted light beams 42 have been vignetted by the aperture stop 261. Hence, in regions closer to the downstream side than the aperture stop 261, light intensity distributions are formed by only the light beams that contribute to the image formation of the original pattern, in a similar manner to the conventional technique.

In this manner, the second illumination light portions 40 are characterized in that they reduce the rotational asymmetry in the x and y directions of the light intensity distributions formed on a lens which is arranged closer to the upstream side than the aperture stop 261 and that they do not contribute to the image formation of the original pattern. Hence, a rotationally asymmetric aberration that occurs due to the temperature distribution generated on each optical member forming the projection optical system 26 can be suppressed by appropriately setting at least one of the position, shape, and light intensity of each second illumination light portions 40 on the incident pupil plane of the projection optical system 26.

Also, in order to prevent the second illumination light portions 40 from influencing the image formation of the original pattern, the positional relationship between the incident pupil on the incident pupil plane of the projection optical system 26 and (the irradiated regions of) the second illumination light portions 40 on the incident pupil plane needs to satisfy a predetermined condition. For example, with respect to the V pattern as shown in FIG. 4A, each second illumination light portion 40 on the incident pupil plane needs to satisfy a condition that it will not enter (inside) the incident pupil even if it is translated at an arbitrary distance in the ξ-axis direction of the incident pupil plane. This is because light (diffracted light) diffracted by the V pattern is generated parallel to the ξ-axis on the incident pupil plane, and the diffracted light beams 42 of the second illumination light portions 40 are produced as light beams obtained by translating the second illumination light portions 40 in parallel to the 4 direction. In a similar manner, consider a case in which the original pattern is a pattern (to be referred to as an "H (Horizontal) pattern" hereinafter) mainly including a line-and-space pattern in a direction parallel to the x-axis. In this case, it is necessary to satisfy a condition in which each second illumination light portion 40 will not enter inside the incident pupil even if each second illumination light portion is translated at an arbitrary distance in the η-axis direction of the incident pupil plane. The argument described above is not limited to the V pattern or the H pattern and can be established for a pattern facing either of the directions.

In this manner, in this embodiment, the second illumination light portions 40 are not present in at least one of the x direction (first direction) and the y direction (second direction) when viewed from the center of the incident pupil of the projection optical system 26. More specifically, the first illumination light portion 30 is not present in the y direction but is present in the x direction when viewed from the center of the incident pupil of the projection optical system 26, and the second illumination light portions 40 are not present in the x direction but are present in they direction when viewed from the center of the incident pupil of the projection optical system 26.

Figure 5A:
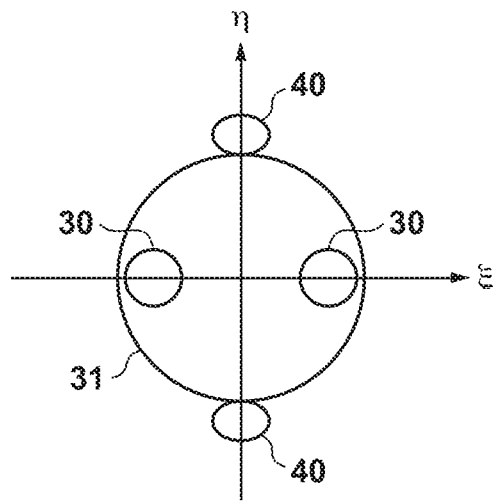
FIGS. 5A and 5B are views each showing an example of illumination light formed by the illumination optical system.

In addition, so-called dipole illumination, in which only the two regions sandwiching the optical axis 1b on the pupil plane of the illumination optical system 110 are used as the effective light sources (secondary light sources), is sometimes used on the original pattern which mainly includes a predetermined line-and-space pattern. Since dipole illumination has a large light amount distribution compared to quadrupole illumination and annular illumination and is asymmetrical in the x and y directions, astigmatism on the axis is generated in the projection optical system 26. The exposure process according to this embodiment is effective for such dipole illumination. More specifically, as shown in FIG. 5A, in addition to the first illumination light portions 30 corresponding to the dipole illumination light beams, the second illumination light portions 40 are set (arranged) outside the incident pupil in a direction perpendicular to a line connecting the dipole illumination light beams (the two first illumination light portions 30). As a result, in relation to the V pattern, it will be possible to suppress or zero out the amount of astigmatism on the axis generated in the projection optical system 26.

Figure 5B:
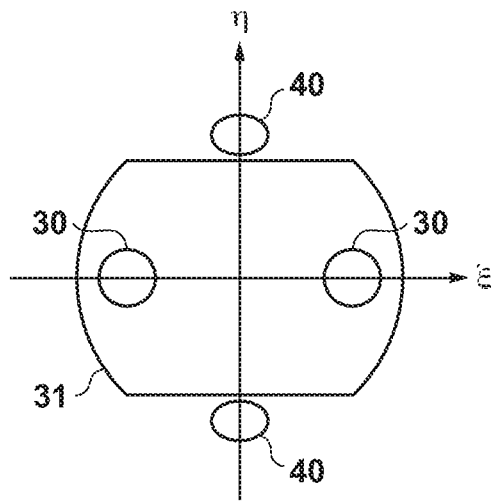

On the other hand, since resolving power is generally required when dipole illumination is to be used, the exposure process is performed in a state in which the NA of the projection optical system 26 has been set to a maximum value. Hence, the diameter of the opening of the aperture stop 261 of the projection optical system 26 is set to a maximum diameter. In addition, each lens forming the projection optical system 26 is generally designed and manufactured to have a diameter sufficient enough to allow light to pass when the diameter of the opening of the aperture stop 261 is set to the maximum diameter. In this case, even if the exposure process according to this embodiment is applied and the second illumination light portions 40 are set outside the incident pupil of the projection optical system 26, the second illumination light portions 40 will not irradiate the lens but will irradiate a mechanical member (for example, a lens barrel) outside the lens. Hence, the asymmetry in the temperature distribution generated on each lens forming the projection optical system 26 cannot be reduced. However, in such a case, the second illumination light portions 40 can be set outside the incident pupil by arranging the shape of the opening of the aperture stop 261 of the projection optical system 26 in a non-circular shape as shown in FIG. 5B. As a result, the asymmetry in the temperature distribution generated on each lens forming the projection optical system 26 can be reduced without degrading the resolving power of the pattern in the direction in to be resolved by using the dipole illumination. Note that the condition that the second illumination light portions 40 will not enter (inside) the incident pupil even if it is translated at an arbitrary distance in the ξ-axis direction of the incident pupil plane is satisfied also in this case as well.

The relationship between the position, the shape, and the light intensity (distribution) of each second illumination light portion 40 on the incident pupil plane of the projection optical system 26 and the amount of astigmatism on the axis generated in the projection optical system 26 will be described next. A parameter referred to as an xy-moment ratio is introduced as an index that represents a capability for suppressing astigmatism on the axis in the projection optical system 26 according to this embodiment. The xy-moment ratio is an amount computed from a light distribution obtained by adding the illumination light and the corresponding diffracted light on the incident pupil plane of the projection optical system 26. Let I(ξ, η) be a sum of the light intensity of the illumination light and the light intensities of all of the diffracted light beams, among the diffracted light beams of all orders, which enter the projection optical system 26 at a point (ξ, η) on the incident pupil plane of the projection optical system 26. The sum I(ξ, η) can be computed (calculated) from the information (the information of diffracted light) showing the pattern of the original 25 and the illumination mode (illumination shape) used when the original 25 is illuminated. First, the sum I(ξ, η) is used to calculate an x moment $M_x$ and a y moment $M_y$ based on the following equations.

$$M_x = \iint I(\xi, \eta) \xi^2 d\xi d\eta$$

$$M_y = \iint I(\xi, \eta) \eta^2 d\xi d\eta$$

In this case, the integral range is preferably set to fall within a range in which the effective region of the lens 262, which is arranged near the pupil plane 26a of the projection optical system 26 and is arranged closer to the upstream side than the aperture stop 261, is projected on the incident pupil plane. However, the integral range may also be set to fall within the range of the incident pupil when the diameter of the opening of the aperture stop 261 of the projection optical system 26 is set to the maximum diameter. A ratio $M_y/M_x$ of they moment $M_y$ and the x moment $M_x$ obtained in this manner is set as the xy-moment ratio.

Figure 6:
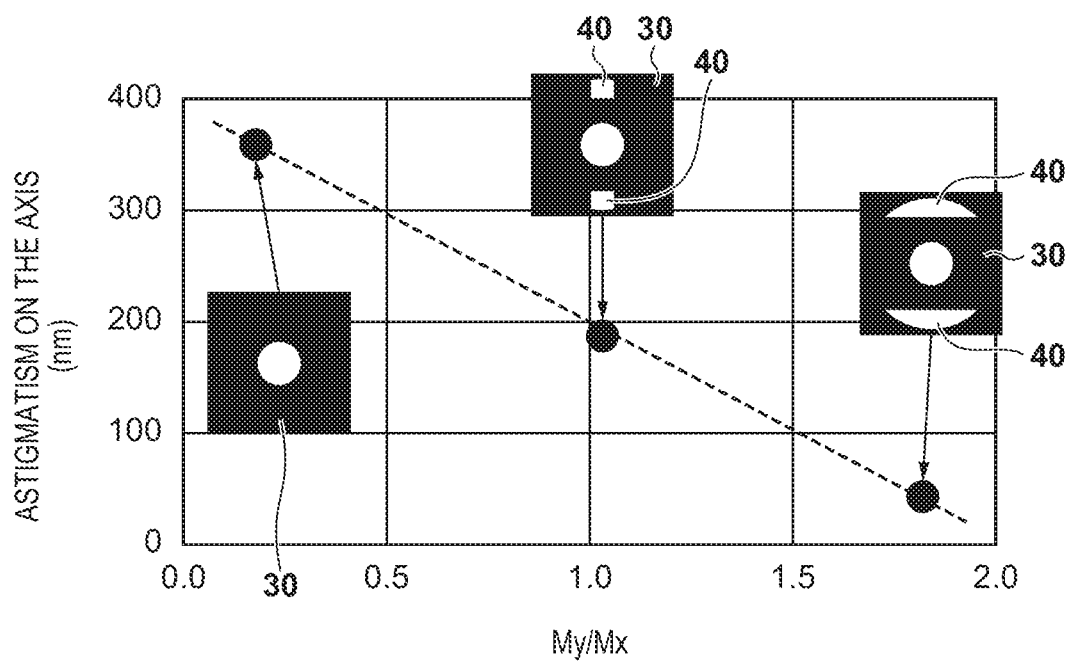
FIG. 6 is a graph showing the relationship between an amount of astigmatism on an axis and an xy-moment ratio obtained by simulation of exposure aberration.

FIG. 6 is a graph showing the relationship between the xy-moment ratio and the amount of astigmatism on the axis (the generated amount of astigmatism on the axis) obtained by an exposure simulation performed for each of the three types of illumination shapes used when illuminating the original pattern. The shapes and light intensities of the first illumination light portions 30 in the center portion are the same, but the sizes of the second illumination light portions 40 in the peripheral portions are different in the three types of illumination shapes. As is obvious from FIG. 6, the generated amount of astigmatism on the axis and the xy-moment ratio are correlated. Hence, a measure for setting the value of the xy-moment ratio to set the generated amount of astigmatism on the axis to a desired value can be obtained. For example, if the generated amount of astigmatism on the axis is to be set to zero, it can be seen, by referring to FIG. 6, that the xy-moment ratio is to be set to a value close to 2. Therefore, the position, the shape, and the light intensity of each second illumination light portion 40 can be set so that the xy-moment ratio will be the value close to 2.

For example, in relation to the position of each second illumination light portion 40, it can be qualitatively estimated that the xy-moment ratio will increase as the position of the second illumination light portions 40 falls further outside the incident pupil plane even if the shape and the light intensity remain the same. Also, in relation to the light intensity of each second illumination light portion 40, it can be qualitatively estimated that the xy-moment ratio will increase as the light intensity of the second illumination light portions 40 increases even if the shape and the position remain the same. Thus, an approximate position and an approximate shape of each second illumination light portion 40 are determined first by considering the constraints of a region that can be used outside the incident pupil, the way the diffracted light travels, and other constraining conditions. Subsequently, the position, the shape, and the light intensity of each second illumination light portion 40 can be determined by using the xy-moment ratio to finely adjust the position and the shape and set the light intensity of each second illumination light portion 40. At this time, the position, the shape, and the light intensity of each second illumination light portion 40 can be set to be variable so that the capability for suppressing astigmatism on the axis in the projection optical system 26 can be finely adjusted in the exposure apparatus 100.

The method of forming the illumination light beams (effective light source distributions) including the first illumination light portion 30 and the second illumination light portions 40 will be described hereinafter. As described above, the plurality of diffraction optical elements 6 can be arranged in the illumination optical system 110. The effective light source distributions can be formed on the pupil plane 14 of the illumination optical system 110 by one diffraction optical element 6 and the stop 13 for forming a predetermined effective light source shape.

Figure 7A:
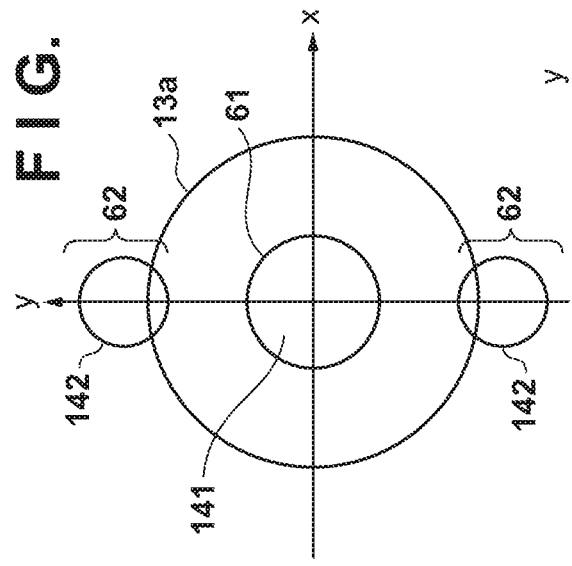
FIGS. 7A to 7D are views each showing effective light source distributions formed on a pupil plane of the illumination optical system.

FIG. 7A is a view showing an example of effective light source distributions formed on the pupil plane 14 of the illumination optical system 110 according to this embodiment. The axes of the directions corresponding to the x-axis and the y-axis shown in each of FIGS. 4A, 4C, and 4D are represented as the x-axis and the y-axis of the pupil plane 14 of the illumination optical system 110. As shown in FIG. 7A, the diffraction optical element 6 is used to form the illumination light beams (distribution shapes) including a first illumination region 61 and second illumination regions 62. The second illumination regions 62 are present on the y-axis of the pupil plane 14 of the illumination optical system 110. The stop 13 is an iris diaphragm 13a that can change the diameter of its opening by driving a plurality of stop members. The effective light source distributions are formed by the portions, of the first illumination region 61 and the second illumination regions 62, inside the opening of the iris diaphragm 13a, and include the first region 141 and the second regions 142. The first region 141 corresponds to the first illumination light portion 30 shown in FIG. 4B, and the second regions 142 correspond to the second illumination light portions 40 shown in FIG. 4B.

Figure 7B:
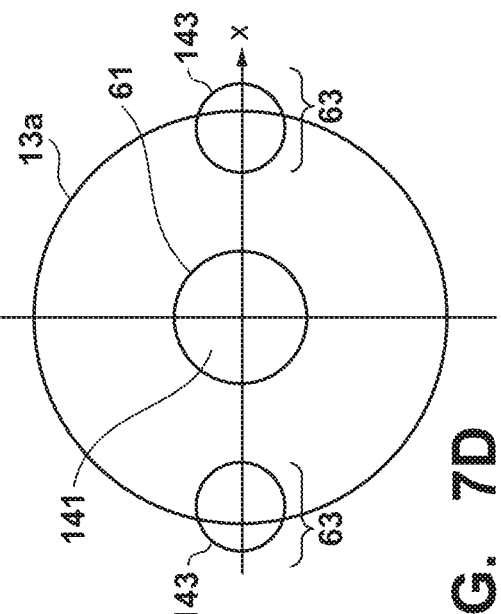

FIG. 7B is a view showing an example of effective light source distributions formed on the pupil plane 14 of the illumination optical system 110 in a case in which the diameter of the opening of the iris diaphragm 13a is decreased with respect to the effective light source distributions shown in FIG. 7A. Since the area of each second region 142 will decrease as the diameter of the opening of the iris diaphragm 13a is decreased, the light amount ratio of each second region 142 with respect to the first region 141 decreases. As a result, the second regions 142 can be appropriately adjusted with respect to the first region 141.

Figure 7C:
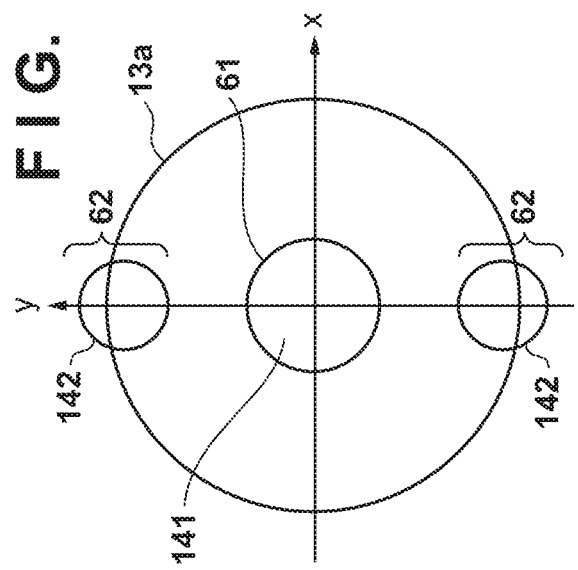
Figure 7D:
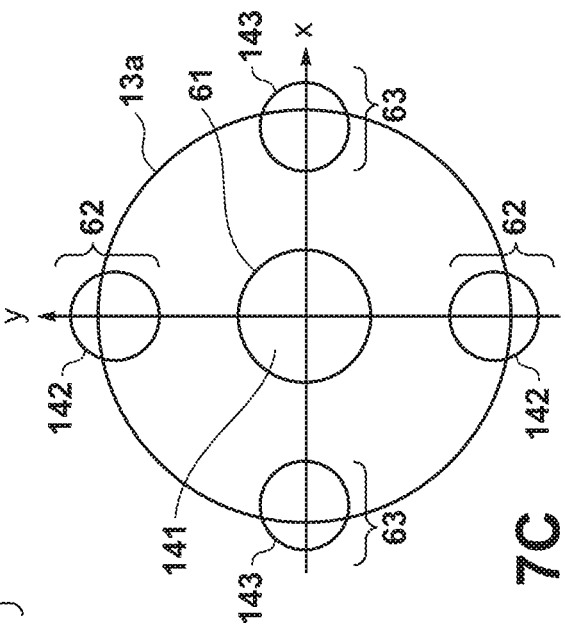

Also, as shown in FIG. 7C, the diffraction optical element 6 can form illumination light beams (distribution shapes) including third illumination regions 63, in addition to the first illumination region 61 and the second illumination regions 62. The third illumination region 63 is present on the x-axis of the pupil plane 14 of the illumination optical system 110. Portions, of the third illumination regions 63, which are inside the opening of the iris diaphragm 13a are set as third regions 143. Referring to FIG. 7C, it can be seen that effective light source distributions including the first region 141 and the second regions 142 and the effective light source distributions including the first region 141 and the third regions 143 can be selected by closing the variable blades forming the light shielding member 8. For example, the effective light source distributions including the first region 141 and the third regions 143 formed on the pupil plane 14 of the illumination optical system 110 by closing, among the variable blades forming the light shielding member 8, the blades corresponding to the y-axis direction are shown in FIG. 7D. On the other hand, the effective light source distributions including the first region 141 and the second regions 142 as shown in FIG. 7A can be formed on the pupil plane 14 of the illumination optical system 110 by closing, among the variable blades forming the light shielding member 8, the blades corresponding to the x-axis direction.

Figure 8A:
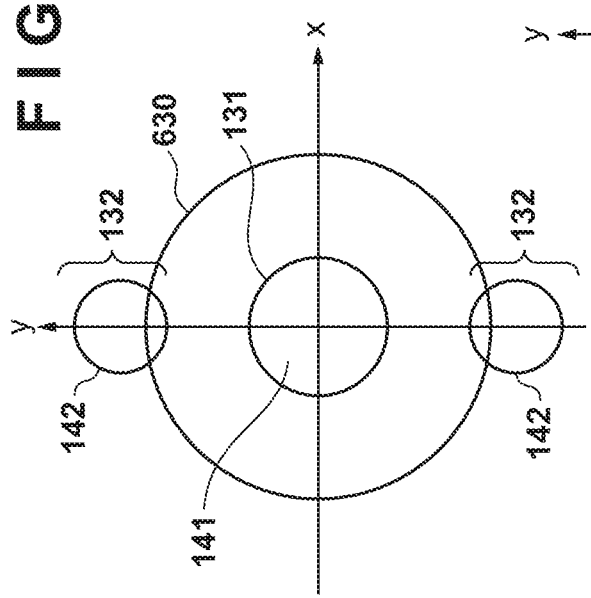
FIGS. 8A to 8D are views each showing effective light source distributions formed on the pupil plane of the illumination optical system.

Another method of forming the illumination light beams (effective light source distributions) including the first illumination light portion 30 and the second illumination light portions 40 will be described next. FIG. 8A is a view showing an example of effective light source distributions formed on the pupil plane 14 of the illumination optical system 110. The axes of the directions corresponding to the x-axis and the y-axis shown in each of FIGS. 4A, 4C, and 4D are represented as the x-axis and the y-axis of the pupil plane 14 of the illumination optical system 110. As shown in FIG. 8A, a circular illumination region 630 is formed by the diffraction optical element 6. Assume that the stop 13 includes a first opening portion 131 and second opening portions 132. The second opening portions 132 are present on the y-axis of the pupil plane 14 of the illumination optical system 110. In the circular illumination region 630, the effective light source distributions include the first region 141 and the second regions 142 which are formed by the first opening portion 131 and the inner-side portions of the second opening portions 132, respectively. The first region 141 corresponds to the first illumination light portion 30 shown in FIG. 4B, and the second regions 142 correspond to the second illumination light portions 40 shown in FIG. 4B.

Figure 8B:
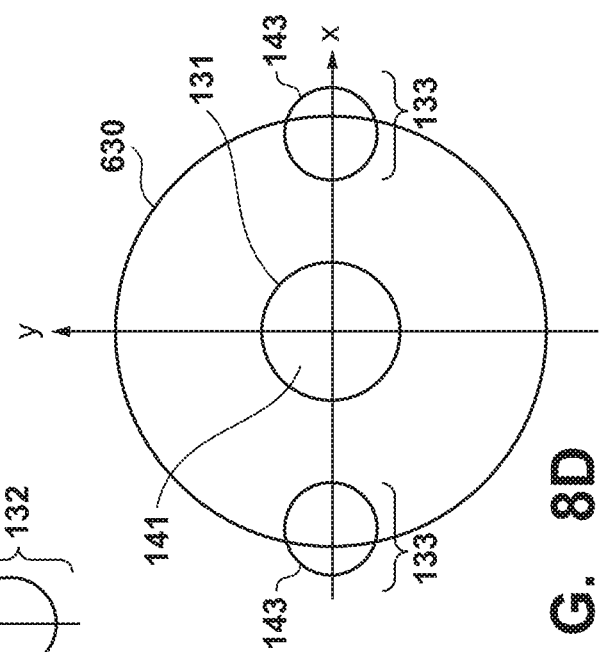

FIG. 8B is a view showing an example of effective light source distributions that are formed on the pupil plane 14 of the illumination optical system 110 in a case in which the diameter of the circular illumination region 630 is decreased with respect to the effective light source distributions shown in FIG. 8A. The diameter of the circular illumination region 630 can be changed by driving the zoom lens that forms the zoom lens unit 11. Since the area of each second region 142 decreases when the diameter of the circular illumination region 630 is decreased, the light amount ratio of each second region 142 with respect to the first region 141 decreases. As a result, the second regions 142 can be appropriately adjusted with respect to the first region 141.

Figure 8C:
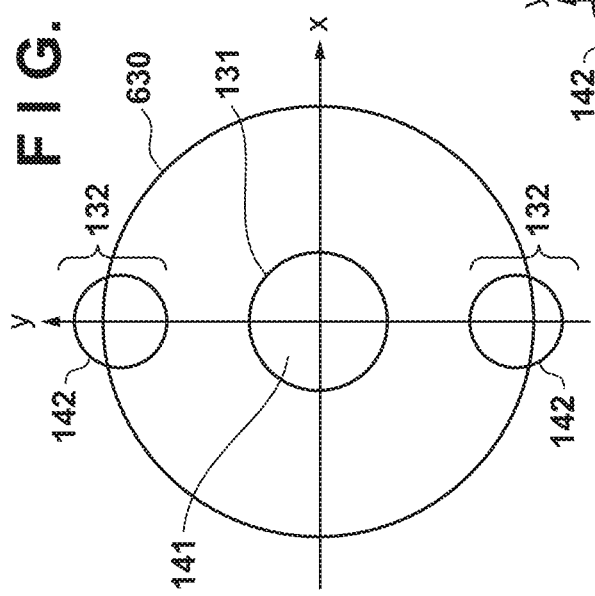
Figure 8D:
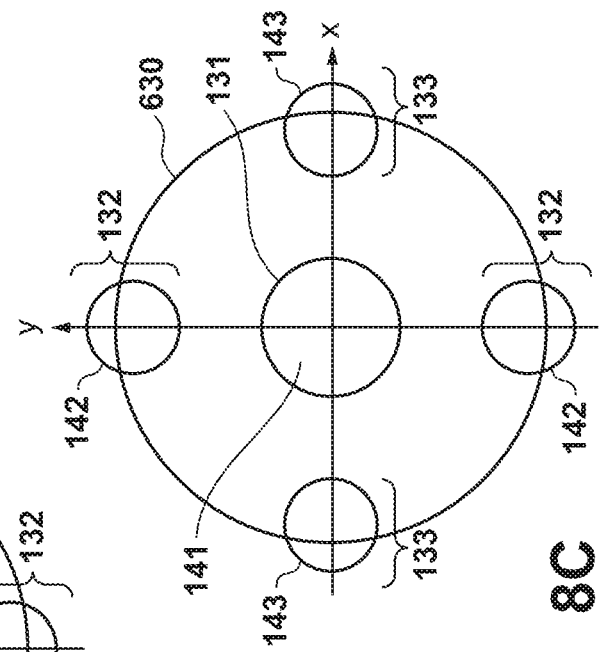

Also, as shown in FIG. 8C, the stop 13 can also include third opening portions 133 in addition to the first opening portion 131 and the second opening portions 132. The third opening portion 133 is present on the x-axis of the pupil plane 14 of the illumination optical system 110. In the circular illumination region 630, the inner-side portion of each third opening portion 133 is the third region 143. Referring to FIG. 8C, it can be seen that effective light source distributions including the first region 141 and the second regions 142 and the effective light source distributions including the first region 141 and the third regions 143 can be selected by closing the variable blades forming the light shielding member 8. For example, FIG. 8D shows the effective light source distributions including the first region 141 and the third regions 143 formed on the pupil plane 14 of the illumination optical system 110 by closing, among the variable blades forming the light shielding member 8, the blades corresponding to the y-axis direction. On the other hand, the effective light source distributions including the first region 141 and the second regions 142 as shown in FIG. 8A can be formed on the pupil plane 14 of the illumination optical system 110 by closing, among the variable blades forming the light shielding member 8, the blades corresponding to the x-axis direction.

A determination method for determining the illumination shape (illumination light) to be used to illuminate the original pattern according to this embodiment will be described next. The determination method may be performed by the control unit 50 of the exposure apparatus 100 or may be performed by an information processing apparatus outside the exposure apparatus 100. The illumination shape is basically determined by the processes to be described below.

First, the illumination mode to be used when the original 25 is to be illuminated and the information of the pattern of the original 25 are obtained. Next, the first illumination light portion 30 of the illumination shape that illuminates the original pattern is set to be the same shape as the effective light source distribution corresponding to the illumination mode. Also, several models are set for the position, shape, and light intensity of each second illumination light portion 40 of the illumination shape used to illuminate the original pattern, the general amount of astigmatism on the axis is estimated by an exposure simulation, and the xy-moment ratio is calculated. Next, the most appropriate xy-moment ratio, that is, the target value of the xy-moment ratio is determined based on the relationship between the generated amount of astigmatism on the axis and the xy-moment ratio. Subsequently, at least one of the position, the shape, and the light intensity of each second illumination light portion 40 is adjusted (determined) so that the xy-moment ratio will be the target value.

Note that the relationship between the generated amount of astigmatism and the xy-moment ratio may be obtained in advance, by an exposure simulation, for each of the plurality of combinations of the illumination mode and the original pattern, and these pieces of information may be stored in a database in (the storage unit of) the exposure apparatus. Since this will allow the most appropriate illumination shape to be determined, based on the information indicating the illumination mode and the pattern of the original 25 to be used in the exposure apparatus 100, from the information stored in the database, it will be advantageous in a case in which the above-described determination method is to be performed in (the control unit 50 of) the exposure apparatus 100. The information indicating the pattern of the original 25 may be input by the user via an input unit (a touch panel, a keyboard, or the like) provided in the exposure apparatus 100. The information indicating the pattern of the original 25 may also be obtained by measuring the pattern of the original 25 held by the original stage 29 by a pattern measurement device provided in the exposure apparatus 100.

In addition, the position, the shape, and the light intensity of each second illumination light portion 40 of the illumination shape used to illuminate the original pattern may also be determined (adjusted) by the processes to be described below. For example, the change in the optical characteristic of the projection optical system 26 due to exposure, that is, the illumination light irradiation operation may be measured, and the position, the shape, and the light intensity of each second illumination light portion 40 may be determined based on this measured change in the optical characteristic. An optical characteristic of the projection optical system 26 that changes by being irradiated by the illumination light, more specifically, the astigmatism on the axis that is a rotationally asymmetric aberration which is generated in the projection optical system 26 is measured during the exposure process, for example, at the timing in which the substrate is to be exchanged or at the timing in which the lot is to be exchanged. Subsequently, the generation of astigmatism on the axis can be suppressed by determining or adjusting at least one of the position, the shape, and the light intensity of each second illumination light portion 40 in accordance with the generated amount of astigmatism on the axis.

Various kinds of techniques known in the art can be applied as the technique for measuring (the change in) the optical characteristic of the projection optical system 26 in the exposure apparatus. A technique for measuring the astigmatism on the axis of the projection optical system 26 will be described as an example here. An opening portion that has two kinds of line-and-space shapes formed by a line-and-space shape parallel to the x-axis and a line-and-space shape parallel to the y-axis is provided on the original 25 or the original stage 29. An opening portion that has a line-and-space shape analogous to that of the opening portion of the original 25, but whose size differs from the opening portion of the original by only amount corresponding to the projection magnification of the projection optical system 26 is provided in the substrate stage 28, and a light amount sensor is provided under this opening portion. The original stage 29 and the substrate stage 28 are moved so that the opening portion provided on the original 25 or the original stage 29 and the opening portion provided on the substrate stage 28 will have an optically conjugate positional relationship. When the light amount is detected by the light amount sensor while finely moving the substrate stage 28 in the z direction in this state, the light amount reaches its maximum value at an in-focus position and decreases as it changes to an out-of-focus position. A z position where the light amount detected by the light amount sensor reaches its maximum value is the best focus position. This kind of best focus position measurement can be performed on both the line-and-space shape parallel to the x-axis and the line-and-space shape parallel to the y axis, and the astigmatism can be measured by obtaining a difference between the best focus positions of both shapes. Hence, by repeatedly measuring the astigmatism at timings during an exposure process, the change in the astigmatism due to the exposure process can be obtained. In this manner, the opening portion provided in the original 25 or the original stage 29, the opening portion provided in the substrate stage 28, the substrate stage 28, and the light amount sensor function as a measurement unit for measuring the astigmatism as the optical characteristic of the projection optical system 26.

Also, since the operation to measure astigmatism requires a certain amount of time, it can influence the throughput of the exposure apparatus 100 if the astigmatism is measured during the exposure process. To avoid such influence, it is preferable to store, as a set together with the illumination mode and other exposure parameters such as the pattern of original 25 and the like, the data related to the temporal change of the astigmatism on the axis when such behavior of the astigmatism on the axis is grasped. Subsequently, when an exposure process is to be performed by using the same illumination mode and the same original 25, the position, the shape, and the light intensity of each second illumination light portion 40 can be adjusted at an appropriate timing by using the data stored in the exposure apparatus without measuring the astigmatism.

Also, the data related to the temporal change of the astigmatism on the axis may be obtained at the factory when the exposure apparatus 100 is to be shipped or obtained when the exposure apparatus 100 is being assembled in a client's facility. By obtaining required data (parameters) in advance before the operation of the exposure apparatus 100 in this manner, it will be possible to suppress the degradation in productivity due to the measurement operation of astigmatism during the exposure process.

Furthermore, the position, the shape, and the light intensity of each second illumination light portion 40 of the illumination shape used to illuminate the original pattern can be determined (adjusted) based on the light intensity distribution formed on the pupil plane 26a of the projection optical system 26 by the light that has passed through the original 25 in a state in which the original 25 is held by the original stage 29. A light intensity distribution including the effective light distributions and the diffracted light beams can be obtained by setting the original 25 in the exposure apparatus 100 and measuring the light intensity distribution formed on the pupil plane 26a of the projection optical system 26 in a state in which the original 25 held by the original stage 29 is illuminated under the illumination mode to be used in the exposure process. The xy-moment ratio is evaluated by virtually adding the second illumination light portions 40 and the diffracted light beams on the light intensity distribution obtained in this manner. In this case, the xy-moment ratio is calculated by changing the position, the shape, and the light intensity of each second illumination light portion 40, and at least one of the position, the shape, and the light intensity of each second illumination light portion 40 is determined so that the xy-moment ratio will be a target value (that is, so that the generated amount of astigmatism on the axis will be in a desired state). Note that instead of virtually adding the second illumination light portions 40, the light intensity distribution measurement may be performed by actually generating an illumination shape including the second illumination light portions 40, using this illumination shape to illuminate the original 25, and measuring the light intensity distribution that is formed on the pupil plane 26a of the projection optical system 26 by the light that has passed through the original 25. However, when the light intensity distribution formed on the pupil plane 26a of the projection optical system 26 is to be measured, the diameter of the opening of the aperture stop 261 of the projection optical system 26 needs to be set to the maximum diameter.

Subsequently, the xy-moment ratio is calculated from the measured light intensity distribution, and the position, the shape, and the light intensity of each second illumination light portion 40 can be tuned so that the xy-moment ratio will be a target value.

Figure 9:
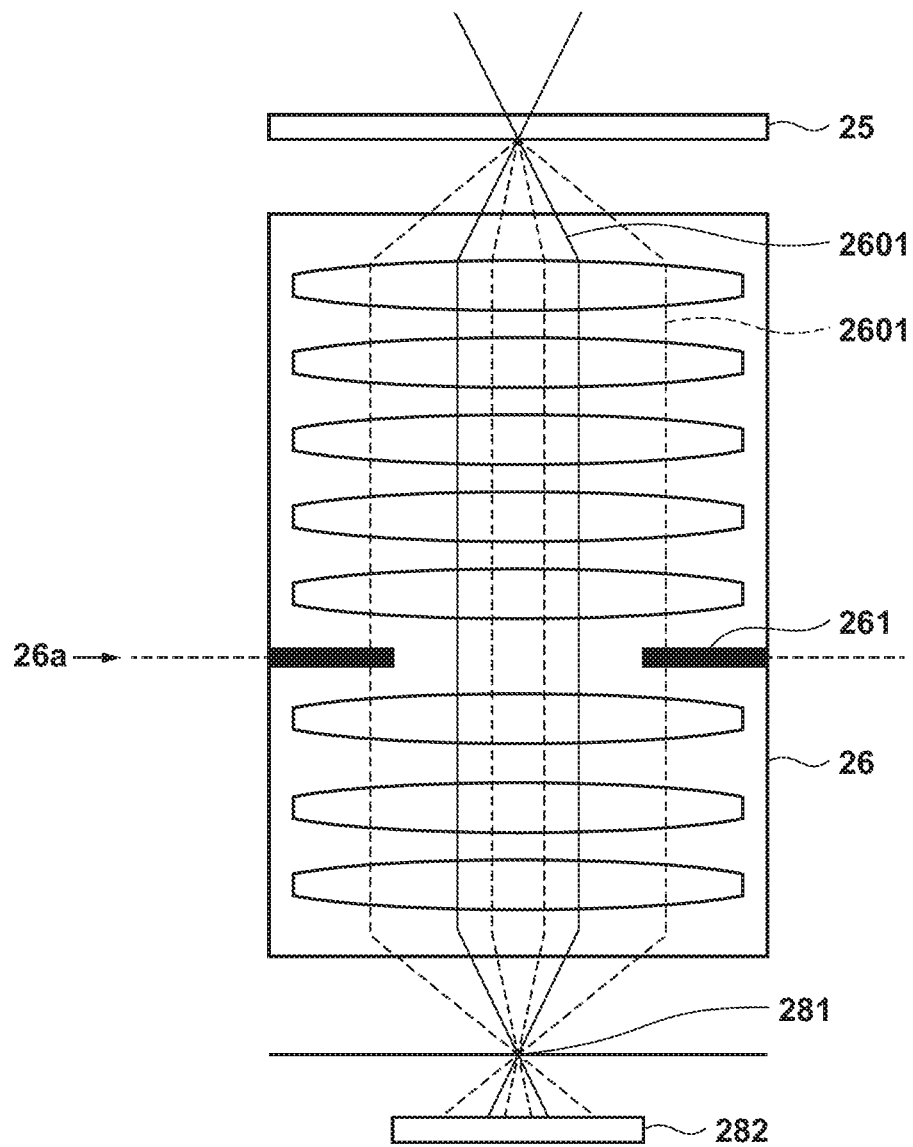
FIG. 9 is a view for explaining a technique for measuring a light intensity distribution formed on the pupil plane of the projection optical system.

Various kinds of techniques known in the art can be applied in relation to the technique for measuring the light intensity distribution formed on the pupil plane 26a of the projection optical system 26. An example of a technique for measuring the light intensity distribution formed on the pupil plane 26a of the projection optical system 26 formed by the light that has passed through the original 25 in a state in which the original 25 is held by the original stage 29 will be described with reference to FIG. 9. The original 25 is set in the exposure apparatus 100, and the illumination mode to be actually used during the exposure process in the exposure apparatus 100 is set. Referring to FIG. 9, it can be seen that illumination light 2601 and diffracted light 2602 have passed through each lens forming the projection optical system 26. The illumination light 2601 and the diffracted light 2602 are focused again and form an image on the image plane of the projection optical system 26.

As shown in FIG. 9, a pinhole 281 is provided on the substrate stage 28, and an image capturing element 282 such as a CCD, a line sensor, or the like for detecting the light amount of light that has passed through the pinhole 281 is arranged at a position which is below the pinhole 281 and is away from the pinhole 281 by a predetermined distance. The substrate stage 28 is moved so as to position the pinhole 281 at the image formation point (the focal point of the projection optical system 26) of the illumination light 2601 and the diffracted light 2602, and the light amount of the light that has passed through the pinhole 281 is detected by the image capturing element 282. As a result, the light intensity distribution formed on the pupil plane 26a of the projection optical system 26 can be obtained. In this manner, the pinhole 281 and the image capturing element 282 function as a measurement unit that measures the light intensity distribution formed on the pupil plane 26a of the projection optical system 26.

Note that although the pinhole 281 arranged in the substrate stage 28 is positioned at the focal point of the projection optical system 26 in FIG. 9, the present invention is not limited to this. The pinhole 281 can be positioned at another position as long as it is on a plane conjugate to the image plane of the projection optical system 26. For example, the pinhole 281 may be arranged immediately below or immediately above the object plane, that is, the original 25 of the projection optical system 26. Also, the pinhole 281 may be arranged at the position of the conjugate plane 20a which is a plane conjugate to the object plane and the image plane of the projection optical system 26 in the illumination optical system 110. Since the masking unit 20 is arranged on the conjugate plane 20a in this embodiment, the masking unit 20 may also be used to form a very small field of view, and this very small field of view may be used as the pinhole 281.

In this embodiment, the original pattern is illuminated by illumination light that includes, in addition to the first illumination light portion 30 which enters the incident pupil of the projection optical system 26 and contributes to the image formation of the original pattern, the second illumination light portions 40 which enter outside the incident pupil of the projection optical system 26 and do not contribute to the image formation of the original pattern. As a result, the generation of a rotationally asymmetric aberration, particularly, astigmatism on the axis of the projection optical system 26 can be suppressed, and the optical characteristic of the projection optical system 26 can be maintained in a favorable state.

A method of manufacturing an article according to the embodiment of the present invention is suitable for manufacturing an article such as a flat panel display, a liquid crystal display element, a semiconductor device, a MEMS or the like. This method of manufacturing includes a step of exposing a substrate coated with a photosensitive agent by using the above-described exposure apparatus 100 and a step of developing the exposed photosensitive agent. An etching step and an ion implantation step are performed on the substrate by using the pattern of the developed photosensitive agent as a mask, thereby forming a circuit pattern on the substrate. By repeating the steps such as these exposure, development, and etching steps, a circuit pattern formed from a plurality of layers is formed on the substrate. In a subsequent step, dicing (processing) is performed on the substrate on which the circuit pattern has been formed, and mounting, bonding, and inspection steps of a chip are performed. The method of manufacturing can further include other known steps (oxidation, deposition, vapor deposition, doping, planarization, resist removal, and the like). The method of manufacturing the article according to this embodiment is superior to the conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-191156 filed on Oct. 18, 2019, which is hereby incorporated by reference herein in its entirety.

What is claimed is:

1. An exposure apparatus that exposes a substrate via an original, comprising:
   an illumination optical system configured to illuminate the original; and
   a projection optical system configured to project a pattern of the original onto the substrate,
   wherein the illumination optical system illuminates the original by illumination light which includes a first portion that enters an incident pupil of the projection optical system and a second portion which enters a region outside the incident pupil, and
   the first portion and the second portion are separated from each other on an incident pupil plane of the projection optical system.

2. The apparatus according to claim 1, further comprising:
   a substrate stage configured to hold the substrate and to move in a first direction and a second direction perpendicular to each other in a substrate plane,
   wherein the second portion is not present in one of the first direction and the second direction when viewed from a center of the incident pupil.

3. The apparatus according to claim 2, wherein the first portion is present in the first direction when viewed from the center of the incident pupil, and the second portion is present in the second direction when viewed from the center of the incident pupil.

4. The apparatus according to claim 1, wherein the second portion is spaced apart from a boundary of the incident pupil.

5. The apparatus according to claim 1, further comprising:
   a control unit configured to determine, based on an optical characteristic of the projection optical system that changes by illumination light irradiation, at least one of a position, a shape, and a light intensity of the second portion on the incident pupil plane.

6. The apparatus according to claim 5, further comprising:
a measurement unit configured to measure the optical characteristic of the projection optical system,
wherein the control unit determines, based on the optical characteristic of the projection optical system measured by the measurement unit, at least one of the position, the shape, and the light intensity of the second portion on the incident pupil plane.

7. The apparatus according to claim 5, wherein the control unit calculates and obtains the optical characteristic of the projection optical system based on information indicating the pattern of the original and information indicating an illumination shape used when the original is illuminated.

8. The apparatus according to claim 5, wherein the optical characteristic of the projection optical system includes a rotationally asymmetric aberration generated in the projection optical system.

9. The apparatus according to claim 1, further comprising:
a measurement unit configured to measure a light intensity distribution formed on a pupil plane of the projection optical system by light that has passed through the original,
wherein at least one of a position, a shape, and a light intensity of the second portion on the incident pupil plane is determined based on the light intensity distribution measured by the measurement unit.

10. A method of manufacturing an article, comprising:
exposing a substrate using an exposure apparatus defined in claim 1;
developing the exposed substrate; and
manufacturing the article from the developed substrate.

11. The apparatus according to claim 1, wherein an aberration generated in the projection optical system by illumination light of the first portion is reduced by that diffracted light that is light from the second portion and is diffracted by the pattern of the original enters the region outside the incident pupil.

12. A method of manufacturing an article, comprising:
exposing a substrate using an exposure apparatus defined in claim 11;
developing the exposed substrate; and
manufacturing the article from the developed substrate.

13. The apparatus according to claim 1, wherein diffracted light that is light from the first portion and is diffracted in a predetermined direction by the pattern of the original enters the incident pupil, and
diffracted light that is light from the second portion and is diffracted in the predetermined direction by the pattern of the original enters the region outside the incident pupil.

14. A method of manufacturing an article, comprising:
exposing a substrate using an exposure apparatus defined in claim 13;
developing the exposed substrate; and
manufacturing the article from the developed substrate.

15. An exposure method for exposing a substrate via an original, comprising:
illuminating the original; and
projecting a pattern of the original onto the substrate via a projection optical system,
wherein in the illuminating the original, the original is illuminated by illumination light which includes a first portion that enters an incident pupil of the projection optical system and a second portion which enters a region outside the incident pupil, and
the first portion and the second portion are separated from each other on an incident pupil plane of the projection optical system.

16. The method according to claim 15, wherein an aberration generated in the projection optical system by illumination light of the first portion is reduced by that diffracted light that is light from the second portion and is diffracted by the pattern of the original enters the region outside the incident pupil.

17. The method according to claim 15, wherein diffracted light that is light from the first portion and is diffracted in a predetermined direction by the pattern of the original enters the incident pupil, and
diffracted light that is light from the second portion and is diffracted in the predetermined direction by the pattern of the original enters the region outside the incident pupil.

18. The method according to claim 15, wherein the pattern of the original includes a pattern in which a plurality of lines are periodically arranged in a first direction,
diffracted light that is light from the first portion and is diffracted in the first direction by the plurality of lines enters the incident pupil, and
diffracted light that is light from the second portion and is diffracted in the first direction by the plurality of lines enters the region outside the incident pupil.

\* \* \* \* \*